United States Patent [19]
Amemiya et al.

[11] Patent Number: 4,906,326
[45] Date of Patent: Mar. 6, 1990

[54] MASK REPAIR SYSTEM
[75] Inventors: Mitsuaki Amemiya, Atsugi; Shunichi Uzawa, Tokyo, both of Japan
[73] Assignee: Canon Kabushiki Kaisha, Tokyo, Japan
[21] Appl. No.: 328,459
[22] Filed: Mar. 24, 1989
[30] Foreign Application Priority Data

Mar. 25, 1988 [JP] Japan .................................. 63-69758
Mar. 25, 1988 [JP] Japan .................................. 63-69759

[51] Int. Cl.⁴ .......................... B44C 1/22; C23F 1/02; B32B 35/00; B05D 5/00
[52] U.S. Cl. .................................... 156/626; 156/644; 156/656; 156/659.1; 156/345; 219/121.12; 219/121.35; 427/8; 427/142; 427/259; 427/264; 427/271; 430/5; 430/296; 430/938
[58] Field of Search ............... 156/626, 627, 643, 644, 156/652, 656, 659.1, 345, 901, 902; 427/8, 10, 43.1, 98, 140, 142, 258, 259, 264, 271; 430/5, 296, 323, 324, 938; 219/121.12, 121.23, 121.35

[56] References Cited
U.S. PATENT DOCUMENTS 4,200,668  4/1980  Segal et al. ......................... 427/53.1
4,256,778  3/1981  Mizukami et al. ...................... 427/10
4,623,607  11/1986  Hosogai .......................... 427/140 X
4,778,693  10/1988  Drozdowicz et al. ......... 427/140 X

*Primary Examiner*—William A. Powell
*Attorney, Agent, or Firm*—Fitzpatrick, Cella, Harper & Scinto

[57] ABSTRACT

A method and apparatus for inspecting and repairing a mask usable in the manufacture of semiconductor microcircuits, by using an electron beam is disclosed. The inspection and repair of a mask pattern are made in a single apparatus, by using a controlled current of an electron beam. For inspection, the surface of a mask having a mask pattern and a radiation-sensitive layer, covering it, is scanned with an electron beam and, by detecting secondary electrons or reflected electrons caused at that time, the state of the pattern is inspected. If any defect is detected, the portion of the radiation-sensitive layer on the detected defect is irradiated with an electron beam of greater magnitude than that for the inspection and, thereafter, the exposed portion of the radiation-sensitive layer is removed. Then, etching or plating is made to the thus uncovered portion, whereby repair of the mask pattern is made.

10 Claims, 6 Drawing Sheets

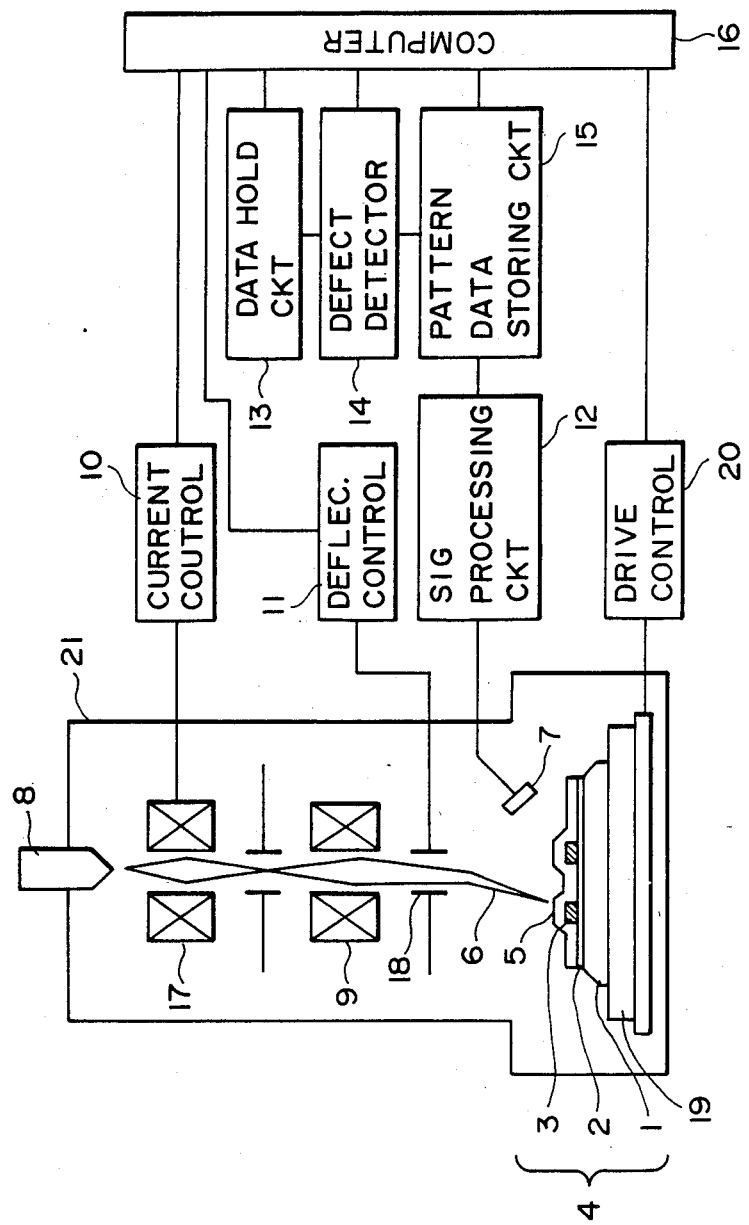
F I G. 1

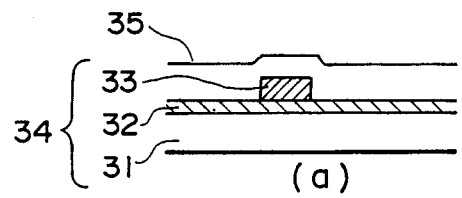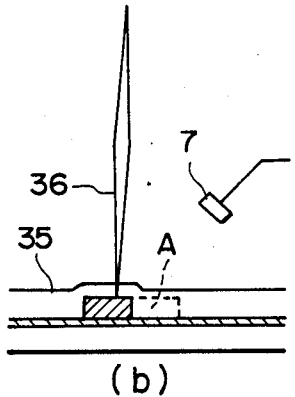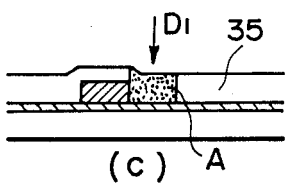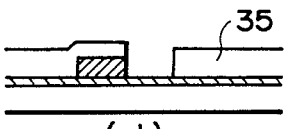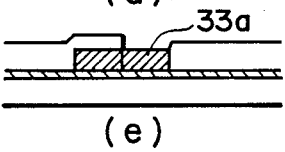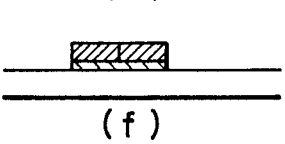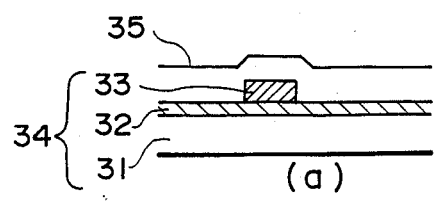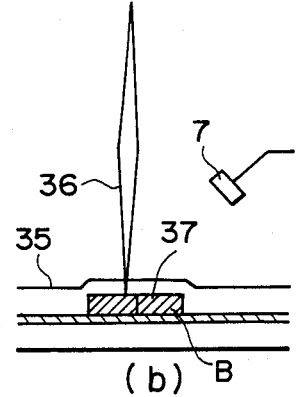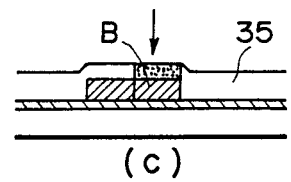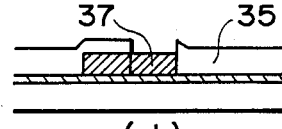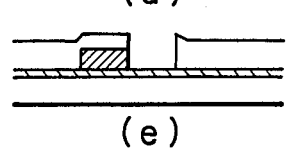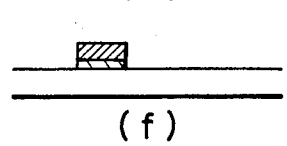
FIG. 3    FIG. 4

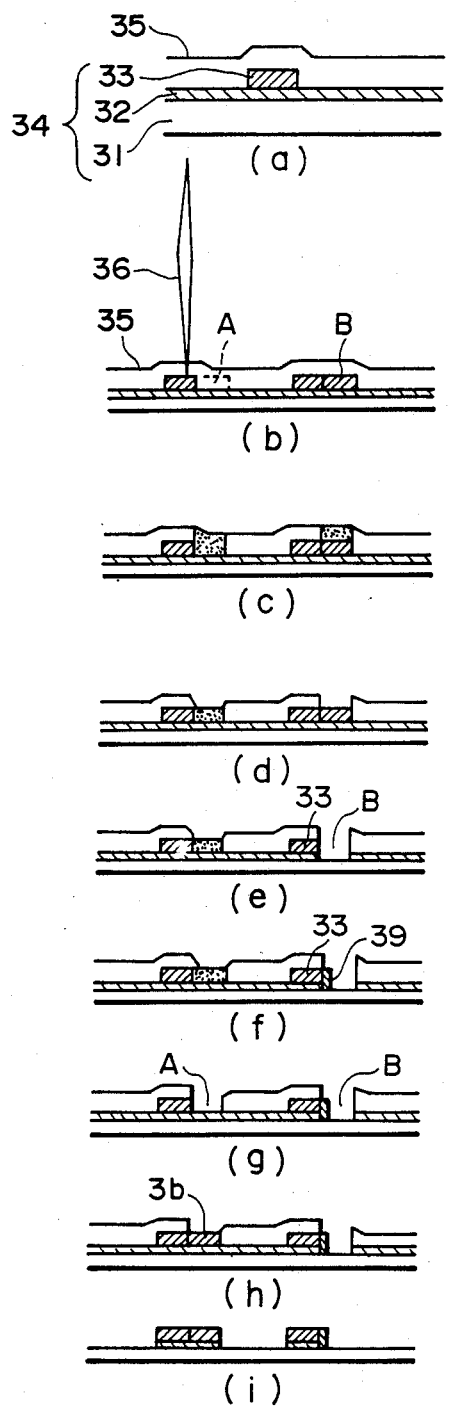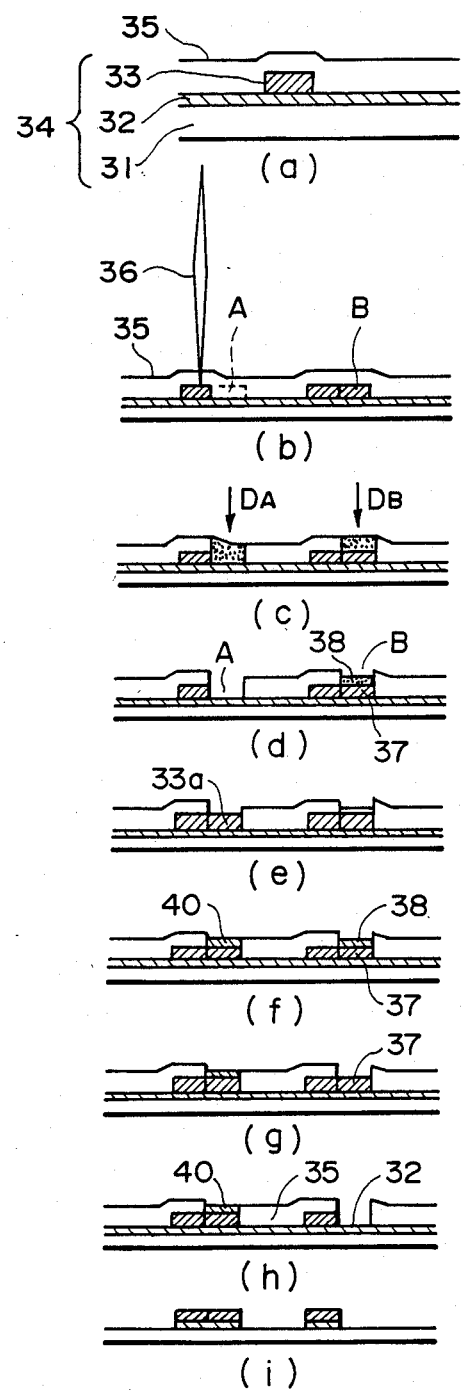
F I G. 7          F I G. 8

MASK REPAIR SYSTEM

FIELD OF THE INVENTION AND RELATED ART

This invention relates to a method and apparatus for inspecting and/or repairing a mask or reticle (hereinafter simply "mask") usable in the manufacture of semiconductor microcircuits, for example, and having a pattern to be transferred onto a workpiece such as a semiconductor wafer, for example.

In addition to an increase in the degree of density and capacity of integrated microcircuits, it is an important factor to improve the quality of a used mask. Thus, among various mask preparing processes, the importance of the inspection and repair of a mask pattern is increasing. Many proposals have been made to such mask inspection and repair. As for the mask inspection, a method is proposed in "The Transactions of The Institute of Electronics and Communication Engineers of Japan" 80/12, Vol. J63-C, No. 12, p. 817, according to which an X-ray mask having a submicron-linewidth pattern is examined by using an electron beam having high resolution.

An example of a conventional type mask inspecting apparatus is illustrated in FIG. 2. Denoted in this Figure at 1 is a mask frame; at 2, is a mask substrate; at 3 is a mask pattern; at 4 is an X-ray mask; at 6 is an electron beam (a beam of charged particles); and at 7 is a secondary electron detector for detecting secondary electrons emitted from a pattern being examined (hereinafter "subject pattern"), as a result of irradiation of the same with the electron beam 6. Denoted at 8 is an electron gun; at 9 is an electron lens; at 12 is a secondary electron signal processing circuit for transforming those signals as obtained at the secondary electron detector 7 into a subject pattern data for comparison examination; at 15 is a subject pattern data storing circuit for holding the subject pattern data; at 13 is a reference pattern data holding circuit for holding a reference pattern data which may be prepared in accordance with a design data concerning the pattern to be inspected; at 14 is a pattern defect detecting circuit for detecting any defect of a pattern, on the basis of comparison of a subject pattern data with a reference pattern data; and at 16 is a computer for controlling the system as a whole.

In operation, electrons emitted from the electron gun 8 are concentrated into a beam by the lens 9 (hereinafter, the beam of concentrated electrons will be referred to as an "electron beam"), the electron beam then irradiates a pattern to be inspected. As a result of irradiation of the pattern with the electron beam, secondary electrons are produced which are then detected by the secondary electron detector 7, whereby corresponding signals are produced. Those detected signals are transformed by the secondary electron signal processing circuit 12 into pattern data related to the pattern being inspected (subject pattern), which data is held by the subject pattern data storing circuit 15. Then, in the pattern defect detecting circuit 14, the pattern data is compared with a reference pattern data held by the reference pattern data storing circuit 13, whereby any defect of the pattern (mask pattern) being inspected is detected.

As a mask repair system, on the other hand, a proposal has been made in "Electron-Beam, X-ray and Ion-Beam Techniques for Submicrometer Lithographies", SPIE, Vol. 471,127; 111 (1984), according to which a laser beam or a convergent ion beam is used.

However, those conventional mask inspection and repair systems involve the following inconveniences.

That is, conventional mask inspecting systems do not include any specific means for executing mask repair. Therefore, for mask repair, it is necessary to transmit the data obtained during the mask inspection to a separate mask repair system to allow the same to execute repair of any detected defect. This results in the following disadvantages:

(1) In addition to a mask inspecting apparatus, use of a mask repairing apparatus is necessary and, for this reason, the arrangement as a whole for mask inspection and mask repair becomes bulky and expensive; and (2) In a mask repairing apparatus, it is necessary to detect again the defect by using the data transmitted thereto. This leads to a prolonged time for the repair.

As for the mask repair itself, on the other hand, there are the following problems:

(i) The mask repair using a laser beam or an ion beam has a large possibility of damaging a mask untolerably, resulting in distortion of the mask. This creates additional defects;

(ii) Further, the repair using a laser beam is only able to remove an unwanted pattern and, additionally, the type of pattern that can be repaired is limited; and (iii) In the mask repair using an ion beam, due to the property of the ion beam, it is not possible to converge the ion beam to a sufficiently small beam diameter and, for this reason, the use of an ion beam is not very suitable to repair of a mask having a pattern of submicron linewidth, such as an X-ray mask.

SUMMARY OF THE INVENTION

It is accordingly an object of the present invention to provide a mask inspection and repair method and apparatus by which, with a simple structure the mask repair can be made efficiently and with reduced cost.

It is another object of the present invention to provide a mask repair method and apparatus by which, without damaging a mask, both removal of an unwanted pattern (or pattern portion) and re-formation (complementation) of a missing pattern (or pattern portion) can be made efficiently and with certainty.

In accordance with one aspect of the present invention, to achieve at least one of these objects, a single apparatus is provided with both a mask inspecting function and a mask repairing function and, for the mask inspection and repair, an electron beam is used in a specific way.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view showing a general arrangement of a first embodiment of the present invention.

FIG. 3(a)–(f) is a schematic view, for explaining a second embodiment of the present invention.

FIG. 4(a)–(f) is a schematic view, for explaining a third embodiment of the present invention.

FIG. 7(a)-(i) is a schematic view, for explaining a fifth embodiment of the present invention.

FIG. 8(a)-(i) is a schematic view, for explaining a sixth embodiment of the present invention.

DESCRIPTION OF THE PREFERRED EMBODIMENTS

Figure 2:
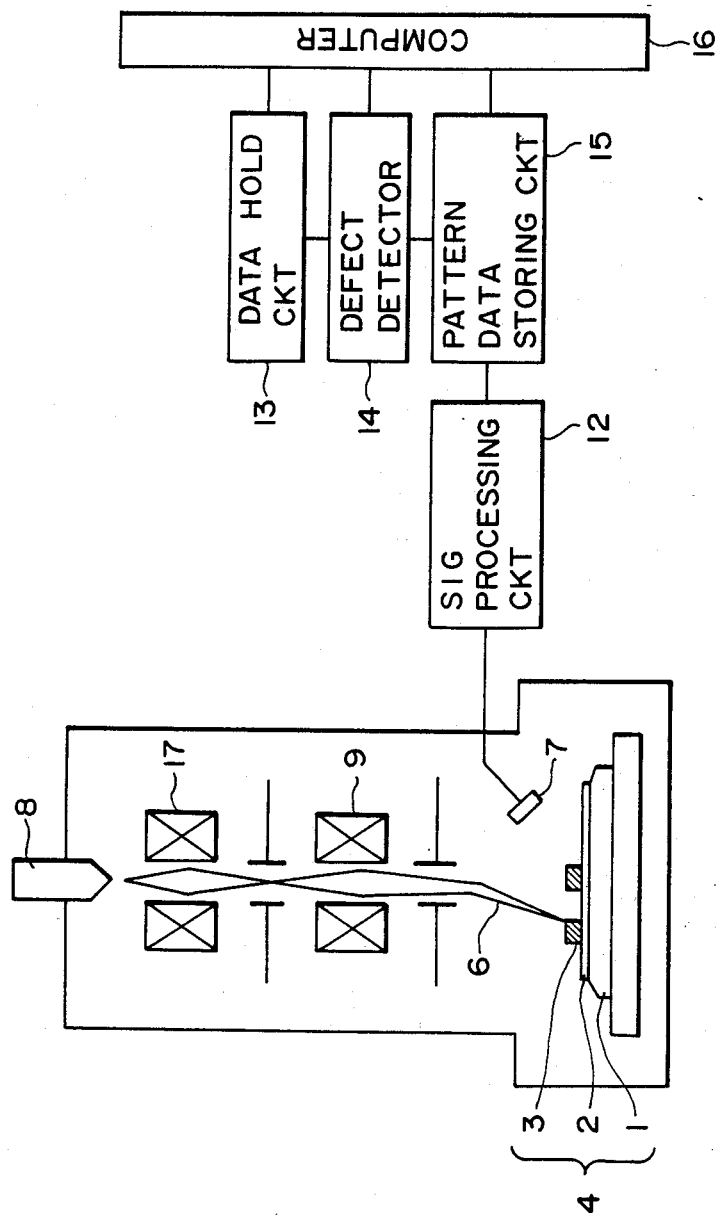
FIG. 2 is a schematic and diagrammatic view showing a general arrangement of a conventional type mask inspecting apparatus.

FIG. 1 shows a general arrangement of a first embodiment of the present invention, wherein like numerals as those of FIG. 2 are assigned to corresponding or similar elements.

In FIG. 1, denoted at 1 is a mask frame; at 2 is a mask substrate; at 3 is a mask pattern; at 4 is a mask; at 5 is a photosensitive or radiation-sensitive layer applied to the mask pattern 3 and the mask substrate 2; at 6 is an electron beam; at 7 is a secondary electron detector; at 8 is an electron gun; at 9 is an electron lens; at 10 is a control circuit for controlling the magnitude or rate of current of an electron beam; at 11 is a deflection controlling circuit; at 12 is a secondary electron signal processing circuit; at 13 is a reference pattern data holding circuit; at 14 is a pattern defect detecting circuit; at 15 is a subject pattern data storing circuit; at 16 is a computer; at 17 is a condenser lens; at 18 is a deflecting electrode; at 19 is a holding means; at 22 is an X-Y stage which is moved by a driving means, not shown; at 20 is an X-Y stage drive controlling circuit; and at 21 is a chamber.

Mask 4 which is going to be subjected to the inspection is coated, on its side having a mask pattern 3, with a photosensitive or radiation-sensitive layer. Electrons emitted from the electron gun 8 are concentrated by the electron lens 9 into a convergent beam (which hereinafter will be referred to as an "electron beam") and, after being deflected by the deflection controlling circuit 11, it is projected upon the mask 4. At this time, by means of the control circuit 10, the magnitude of the current of the electron beam is adjusted, taking into account the scan speed, the acceleration voltage and the like, so as to prevent substantial reduction in film thickness of the photosensitive layer 5 when in a later stage it is developed. This adjustment can be made by changing the lens power of the condenser lens 17. Secondary electrons as can be created as a result of the irradiation of the mask 4 with the electron beam 6 are detected by the secondary electron detector 7. The thus detected signals can be processed by the secondary electron signal processing circuit 12 in a known manner, like that of the data processing in a measuring apparatus such as an SEM (Scanning Electron Microscope). The data obtained by the signal processing is compared within the pattern defect detecting circuit 14 with data (reference pattern data) held by the reference pattern data holding circuit 13, whereby any defect of the pattern can be detected. Subsequently, on the basis of the data related to any detected defect of the pattern, the deflection control circuit 11 operates to controllably deflect the electron beam 6 to expose the portion of the photosensitive layer 5 corresponding to the detected defect portion to the electron beam, for repair of the defect. At this time, by means of the control circuit 10, the magnitude of the current of electron beam is controlled, while taking into account the scan speed, the acceleration voltage and the like, so that a larger current flows than that at the time of detection of the defect of the pattern. In other words, the current is controlled to such magnitude that the film thickness of the photosensitive layer 5 is reduced when the same is developed in a later stage. Details of this will be described later.

The mask 4 having been exposed in the described manner is then subjected to the development of the photosensitive layer 5 and, thereafter, pattern correction or repair is made by means of an etching or plating process, a lift-off process and the like.

Setting different magnitudes of current of electron beam at the time of inspection and at the time of repair, while taking into account the scan speed, the acceleration voltage and the like, is to prevent substantial sensitization of a photosensitive material applied to the mask surface, during the inspection, and, on the other hand, to assure sensitization of the photosensitive material in the repair process to cause reduction in film thickness by the development. Namely, it is made to variably define an appropriate quantity of irradiated electron beam (dose per unit area of the resist surface) for the inspection and for the repairing. The dose adjustment may, of course, be made by changing the scan speed of the electron beam, by changing the times of scan with the laser beam or by changing the acceleration voltage.

While, in the described example, secondary electron signals from a mask surface are detected for detection of any defect of a mask pattern, the signals to be detected are not limited to the secondary electrons. For example, signals of electrons transmitted through a mask, reflected electrons, Auger electrons or fluorescent X-rays may be detected.

Next, description will be made of the manner of mask repair according to a second embodiment of the present invention, which uses the mask inspecting and repairing apparatus having been described with reference to the first embodiment. In the second embodiment to be described below, a positive resist is used as the material of a photosensitive or radiationsensitive layer.

In FIG. 3, parts (a)–(f) schematically illustrate the steps to be made in sequence in accordance with the mask repair method of the second embodiment.

Denoted in FIG. 3 at 31 is a mask substrate; at 32 is a plating substrate layer; and at 33 is a mask pattern. The mask substrate 31, the plating substrate layer 32 and the mask pattern 33 in combination provide a mask 34. The mask 34 is supported by a frame, not shown. Denoted at 35 is a photosensitive or radiationsensitive layer which covers the surface of the mask 34 on one side thereof on which the mask pattern is formed. Denoted at 36 is an electron beam which is deflected by a deflecting means 18 to thereby scan the mask surface. Denoted at 7 is a secondary electron (reflected electron) detector for detecting secondary electrons or reflected electrons as emitted from the mask surface when it is scanned by the electron beam. Reference character A denotes a defect (which is called a "transparent defect") in which a pattern that should normally exist is missing.

The process to be made in accordance with this embodiment will be explained, in a sequence of (a)–(f) of FIG. 3.

Step (a)

First, a photosensitive material is applied to a mask 34 to form a photosensitive layer 35 thereupon.

Step (b)

Second, the mask 34 is scanned with an electron beam 36, and secondary electrons which are generated as a result of the irradiation of a mask pattern 33 by the electron beam 36 are detected by the secondary electron detector 7 (FIG. 3, part (b)). At this time, the magnitude of the current of electron beam 36 is adjusted, while taking into account the scan speed, the acceleration voltage and the like, to such a level by which substantially no change appears in the photosensitive layer 35 when the same is developed (i.e. it is not substantially sensitized). The signals detected by the secondary electron detector 7 are then processed by the secondary electron signal processing circuit 12, and the thus obtained data is compared in the pattern defect detecting circuit 14 with a reference pattern data, whereby any defect of the pattern is detected. In this particular example, the lack of the pattern portion as denoted by reference character A is detected.

Step (c)

Subsequently, on the basis of a detection signal corresponding to the detected defect, an electron beam is applied to the portion A (FIG. 3, part (c)). At this time, the quantity of irradiated electron beam (i.e. dose D1) is adjusted to an amount substantially equal to that to be provided in usual electron beam exposure (printing). Namely, the magnitude of the current of electron beam is set to such level by which the photosensitive or radiationsensitive layer 35 is sufficiently sensitized.

Step (d)

Next, the mask 34 is subjected to a developing process, whereby the material of the photosensitive layer 35 is removed (FIG. 3, part (d)).

Step (e)

Subsequently, a mask pattern 33a of a predetermined thickness is formed at the portion A (the region the photosensitive material of which has been removed), this being made by plating or otherwise (FIG. 3, part (e)). In this particular example, where a plating process is to be used, an electroplating or an electroless plating may preferably be used. This is also with the case of other embodiments which will be described in a later part of this Specification.

Step (f)

Finally, the photosensitive layer 35 and the plating substrate layer 32 are removed as required, whereby the mask repair is accomplished (FIG. 3, part (f)).

FIG. 4, parts (a)–(f), illustrate the steps of a process to be made in accordance with a third embodiment of the present invention. This embodiment is an example wherein an unwanted or unnecessary pattern (which is called a "non-transparent defect") is removed.

Step (a)

The content of this step is substantially the same as that in the second embodiment described above.

Step (b)

Then, as in the second embodiment, a mask 34 surface is scanned with an electron beam 36 and, on the basis of detection by the secondary electron detector 7, any defect of the mask pattern is detected (FIG. 4, part (b)). By this, in this particular example, a non-transparent defect (unnecessary pattern 37) as depicted by reference character B is detected.

Step (c)

Subsequently, on the basis of a detected signal related to the detected defect B, the portion of a photosensitive layer 35 corresponding to the portion B is exposed to an electron beam (FIG. 3, part (c)).

Step (d)

Next, the mask 34 is subjected to a developing process, whereby the exposed portion of the photosensitive layer 35 is removed (FIG. 4, part (d)).

Step (e)

Subsequently, by means of dry etching or wet etching or otherwise, the unnecessary pattern 37 of the portion B is removed (FIG. 4, part (e)).

Step (f)

Finally, the photosensitive layer 35 and the plating substrate layer 32 are removed as required, whereby the mask repair is accomplished (FIG. 4, part (f)).

Figure 5:
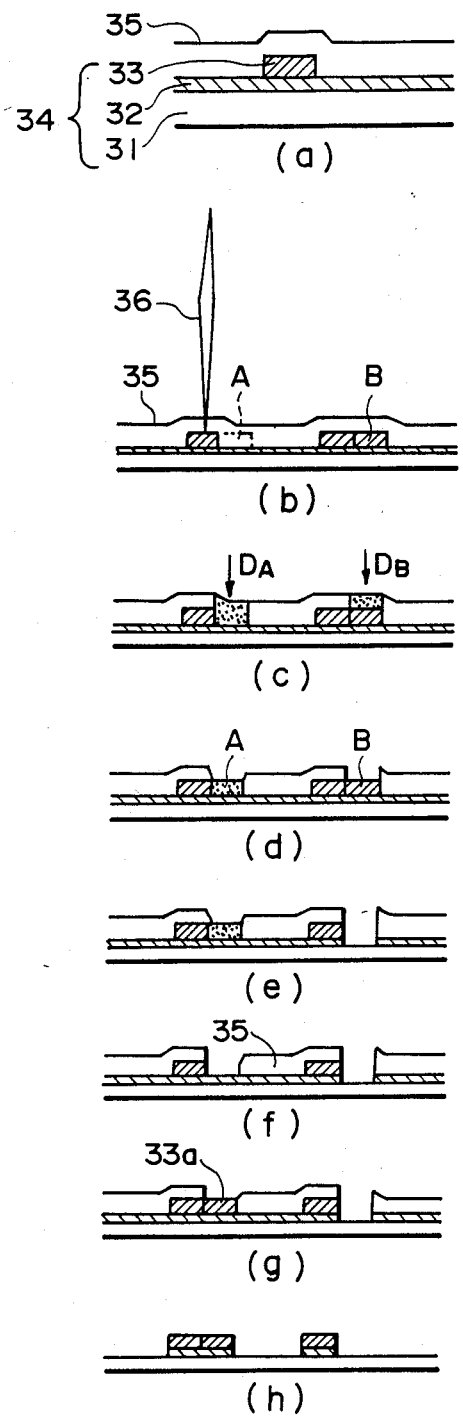
FIG. 5(a)-(h) is a schematic view, for explaining a fourth embodiment of the present invention.

FIG. 5, parts (a)–(h), illustrate the steps of a process to be made in accordance with a fourth embodiment of the present invention. This embodiment corresponds to an example wherein a transparent defect and a non-transparent defect, both of which are present on the same mask, can be corrected or repaired uninterruptedly.

Step (a)

The content of this step is substantially the same as those in the second and third embodiments described above.

Step (b)

Then, a mask 34 surface is scanned with an electron beam 36, and a transparent defect at portion A as well as a non-transparent defect at portion B are detected (FIG. 5, part (b)).

Step (c)

Thereafter, on the basis of the detection, the portions A and B are irradiated with an electron beam (FIG. 5, part(c)). At this time, the quantity $D_A$ of beam irradiation at the portion A is set smaller than the quantity $D_B$ of beam irradiation at the portion B (i.e. $D_A < D_B$).

Step (d)

Figure 6:
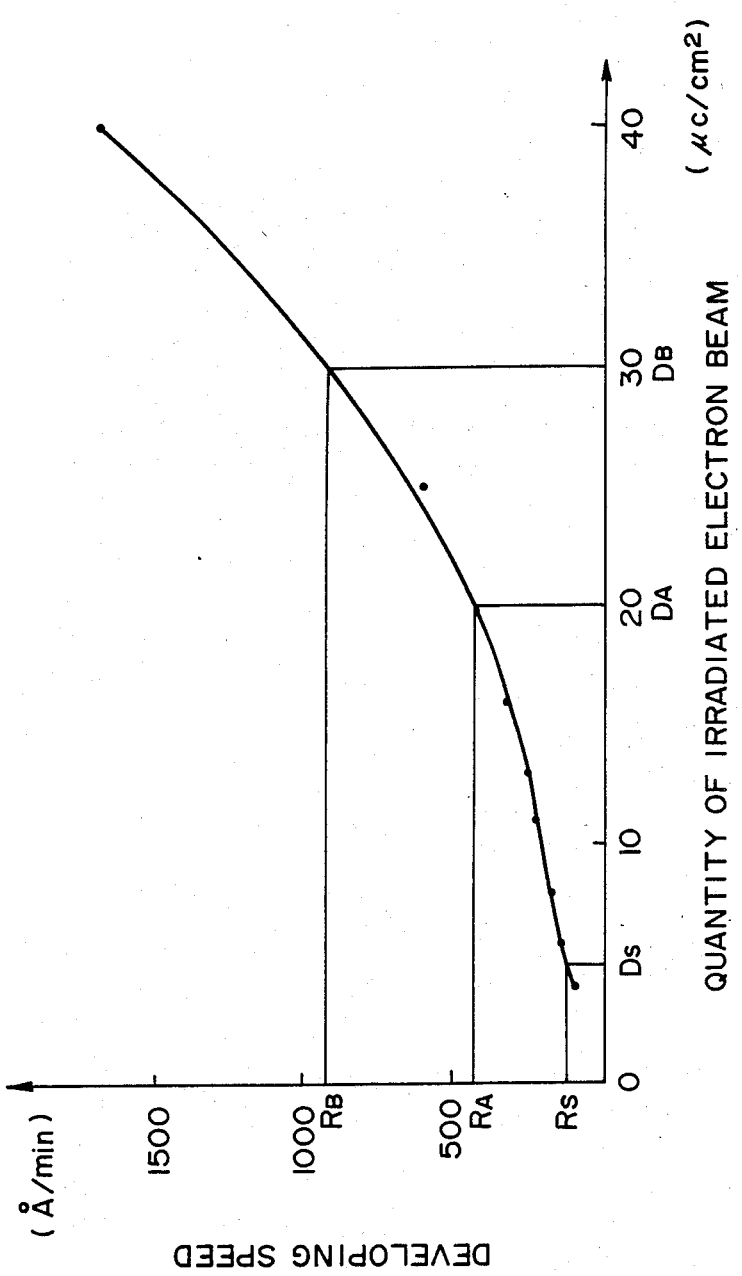
FIG. 6 is a graph showing the relationship between the quantity of irradiated electron beam and the developing speed.

Subsequently, the mask 34 is subjected to a developing process. At this time, the developing time is set so that the photosensitive material covering the portion A remains, but the photosensitive material covering the portion B is removed (FIG. 5, part (d)). As an example, such developing time is determined on the basis of a graph such as shown in FIG. 6. Here, the graph of FIG. 6 represents the relationship of the developing speed (the axis of ordinate) to the quantity of irradiation (the axis of abscissa). In this particular example, a PMMA resist was used and an acceleration voltage of 20 Kv and a developing liquid of isoamyl acetate were used. The developing speed to the quantity of irradiation under these conditions is such as illustrated. It is seen that the relationship of the developing speed to the quantity of irradiation is changeable, depending on a used resist material, a used acceleration voltage for an electron beam and a used developing agent. Therefore, upon determination of the developing time, it is necessary to fully take these factors into consideration.

The term "developing speed" means the amount (rate) of reduction in film thickness of a photosensitive layer in the direction of its thickness, per unit time, when the photosensitive layer is dipped in a developing liquid. In this example, the developing time $t_d$ is determined to satisfy the following relationship:

$$T_0/R_A > t_d > T_0/R_B \quad (1)$$

where $T_0$ is the initial film thickness of the photosensitive layer, and $R_A$ and $R_B$ are the developing speeds at the portions A and B, respectively.

When the height of a pattern on a mask is denoted by P and if the developing time $t_d$ is selected to satisfy the following relationship:

$$(T_0-P)/R_A > t_d > T_0/R_B \, (T_0 > P) \quad (2)$$

it is possible to prevent damage of an adjacent pattern portion, juxtaposed to the portion A, during the etching process to be made in the next step (e). To assure this relationship, a relationship such as follows is satisfied:

$$(T_0-P)/R_A > T_0/R_B \quad (3)$$

Also, to ensure the relationship (3), the developing speeds $D_A$ and $D_B$ are predetermined so as to satisfy the following relationship:

$$(T_0-P)/T_0 > D_A/D_B \quad (4)$$

Further, when the quantity of electron beam irradiation at the time of pattern inspection is denoted by $D_S$ and if the developing speed corresponding to such $D_S$ is denoted by $R_S$, then it is necessary to determine the value $D_S$ so that a relationship $R_S < R_A$ is satisfied.

Step (e)

Next, the unnecessary pattern at the portion B is removed by an etching process or otherwise (FIG. 5, part (e)). On that occasion, also the plating substrate layer 32 at the portion B is removed.

Step (f)

Next, development of the photosensitive layer 35 is executed again. The developing time on this occasion is set so that only the portion of the photosensitive layer at the portion A is removed (FIG. 5, part (f)).

Step (g)

Subsequently, a supplementing pattern 33a is formed at the portion A, this being made by plating, for example (FIG. 5, part (g)).

Step (h)

Finally, the plating substrate layer 32 and the photosensitive layer 35 are removed as required, whereby the mask repair is accomplished (FIG. 5, part (h)).

FIG. 7 illustrates a fifth embodiment of the present invention, which corresponds to an example wherein, after repair of a non-transparent defect such as at B in the fourth embodiment and during repair of a transparent defect such as at A, an additional step is included to prevent plating formation on a side wall surface of the pattern at the portion B.

Steps (a)–(e)

Those processes to be made up to the completion of the repair of a non-transparent defect at portion B, are substantially the same as those made in the fourth embodiment shown in FIG. 5 (FIG. 7, parts (a)–(e)). It is to be noted here that, in this embodiment, it is not always necessary to remove the plating substrate layer.

Step (f)

Subsequently, on a side wall surface of a pattern 31, uncovered by the removal of the photosensitive material at the portion B, a protecting layer 39 for preventing re-formation of any pattern on that surface is provided (FIG. 7, part (f)). Such a protecting layer may be provided by plating, for example, of Ni to about several hundred angstroms, for example.

Steps (g)–(i)

Subsequently, as in the fourth embodiment, the photosensitive material layer 35 at the portion A is removed (FIG. 7, part (g)); a pattern 36 is formed at the portion A by plating, for example (FIG. 7, part (h)); and finally the photosensitive layer 35 and the plating substrate layer 32 are removed, whereby the mask repair is accomplished (FIG. 7, part (i)). In this example, film is not easily formed by plating upon the protecting layer 39, as compared with the film formation on the plating substrate layer 32. Therefore, a pattern is formed only at the portion A, and no pattern is formed at the portion B.

Referring now to FIG. 8, a sixth embodiment of the present invention will be explained. This embodiment corresponds to an example wherein, when a transparent defect and a non-transparent defect should be corrected or repaired uninterruptedly, the transparent defect at a portion A is first repaired as compared with the fourth embodiment.

Step (a)

The process to be made in this step is substantially the same as that in the foregoing embodiment.

Step (b)

Then, by the electron beam scan, a transparent defect at portion A and a non-transparent defect at portion B are detected (FIG. 8, part (b)).

Step (c)

Then, portions of a photosensitive layer 35 covering the portions A and B are irradiated with an electron beam (FIG. 8, part (c)). At this time, the quantity of irradiation at the portions A and B is preset to satisfy $D_A > D_B$.

Step (d)

Subsequently, the photosensitive layer is developed. By this developing process, the photosensitive material at the portion A is removed, but the photosensitive material at the portion B partially remains (FIG. 8, part (d)). Namely, a photosensitive layer 38 of a reduced thickness remains on the unnecessary pattern 37.

Step (e)

Then, plating is made, whereby a film growing with plating is formed on the plating substrate layer 32 at the portion A and, finally, a pattern 39 is formed thereat (FIG. 8, part (e)).

Step (f)

Subsequently, an etching preventing or resistive layer 40 is formed upon the thus repaired and re-formed pattern 33a at the portion A (FIG. 8, part f)). This etching preventing layer 40 is provided to protect the pattern 33a against etching thereof during an etching process to be made later, removing the unnecessary pattern at the portion B. When a pattern is made of gold, such etching preventing layer 40 may be provided by plating the pattern 33a with Ni, for example.

Step (g)

Next, the photosensitive material layer 38 on the unnecessary pattern 37 at portion B is removed (FIG. 8, part (g)).

Step (h)

Then, the unnecessary pattern 37 at portion B is removed by etching, for example (FIG. 8, part (h)). When a pattern is made of gold and if the etching preventing layer 40 is formed of Ni, the unnecessary pattern removing etching may be made by a dry etching process using Kr, for example.

Step (i)

Finally, the plating substrate layer 32, the photosensitive layer 35 and the etching preventing layer 40 are removed as required, whereby the mask repair is accomplished (FIG. 8, part (i)).

While the invention has been described with reference to the structures disclosed herein, it is not confined to the details set forth and this application is intended to cover such modifications or changes as may come within the purposes of the improvements or the scope of the following claims.

What is claimed is:

1. An apparatus for inspecting and repairing a mask, comprising:
   beam producing means for producing an electron beam;
   deflecting means for deflecting the electron beam from said beam producing means;
   holding means for holding a mask having a mask pattern and a radiation-sensitive surface layer, said holding means holding the mask so that it can be irradiated with the electron beam deflected by said deflecting means;
   adjusting means for adjusting the quantity of electron beam with which the mask held by said holding means is irradiated;
   electron detecting means for detecting electrons produced when the mask is irradiated with the electron beam adjusted by said adjusting means;
   holding means for holding a reference pattern data which provides a reference to the mask pattern;
   defect detecting means for comparing a pattern data, corresponding to a result of detection by said electron detecting means, with the reference pattern data held by said reference pattern data holding means, to detect any defect of the mask pattern; and
   repairing means for controlling said adjusting means and said deflecting means in accordance with data corresponding to any defect detected by said defect detecting means, to repair the detected defect of the mask pattern.

2. An apparatus according to claim 1, wherein said repairing means controls said adjusting means so that, upon repair, the mask is irradiated with an electron beam of a larger quantity than that at the time of inspection.

3. An apparatus according to claim 1, wherein said adjusting means adjusts the quantity of electron beam irradiation by changing the magnitude of the current of electron beam.

4. An apparatus according to claim 1, wherein said adjusting means adjusts the quantity of electron beam irradiation by changing an acceleration voltage of the electron beam.

5. A method of repairing a defect of a pattern of a mask, wherein the pattern is formed on a substrate, said method comprising the steps of:
   coating the mask with a resist material;
   inspecting any defect of the pattern by using an electron beam;
   developing the resist material so that the defect of the pattern is uncovered; and
   applying a complementing material to the exposed defect to complement the defect.

6. A method of repairing any defect of a pattern of a mask, wherein the pattern is formed on a substrate and the defect is provided by an unnecessary pattern portion, said method comprising the steps of:
   coating the mask with a resist material;
   inspecting any defect by using an electron beam;
   developing the resist material to uncover the defect of the pattern; and
   removing, by etching, the uncovered unnecessary pattern portion, to thereby repair the pattern.

7. A method of inspecting a photomask having a mask pattern selectively formed on a substrate and of repairing any defect of the photomask, said method comprising the steps of:
   coating the mask with a positive type resist material;
   inspecting any defect of the mask pattern by using an electron beam, the quantity of irradiated electron beam being set to a level by which substantially no reduction in film thickness results when the resist material is developed;
   selectively irradiating a portion of the resist coating corresponding to the detected defect, with an electron beam of a quantity greater than the first-mentioned quantity;
   developing the portion of the resist coating having been irradiated with the electron beam, so as to uncover the detected defect; and
   repairing the uncovered defect.

8. A method according to claim 7, wherein said repairing is made by a plating or lift-off process.

9. A method according to claim 7, wherein said repairing is made by an etching process.

10. A method according to claim 7, wherein said repairing is made by a plating, lift-off or etching process.

* * * * *